United States Patent
Tanaka et al.

(10) Patent No.: US 10,672,337 B2
(45) Date of Patent: Jun. 2, 2020

(54) DISPLAY DEVICE INCLUDING PIXEL CIRCUITS INCLUDING DISPLAY ELEMENTS DRIVEN BY ELECTRIC CURRENT

(71) Applicant: Sharp Kabushiki Kaisha, Sakai, Osaka (JP)

(72) Inventors: Shinya Tanaka, Sakai (JP); Taketoshi Nakano, Sakai (JP); Asahi Yamato, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/484,130

(22) PCT Filed: Sep. 12, 2017

(86) PCT No.: PCT/JP2017/032830
§ 371 (c)(1),
(2) Date: Aug. 7, 2019

(87) PCT Pub. No.: WO2019/053769
PCT Pub. Date: Mar. 21, 2019

(65) Prior Publication Data
US 2019/0355304 A1 Nov. 21, 2019

(51) Int. Cl.
*G09G 5/10* (2006.01)
*G09G 3/3233* (2016.01)
(Continued)

(52) U.S. Cl.
CPC .............. *G09G 3/3233* (2013.01); *G01K 1/14* (2013.01); *G01K 7/22* (2013.01); *G09G 3/3266* (2013.01);
(Continued)

(58) Field of Classification Search
CPC .. G09G 3/3233; G09G 3/3266; G09G 3/3275; G09G 3/3225; G09G 3/20; G01K 7/22; G01K 1/14; H01K 27/3276
(Continued)

(56) References Cited

U.S. PATENT DOCUMENTS

2007/0075940 A1* 4/2007 Nakamura ............. G09G 3/325
345/77
2009/0009107 A1* 1/2009 Nomura ............... G09G 3/3225
315/307
(Continued)

FOREIGN PATENT DOCUMENTS

JP 10-31204 A 2/1998
JP 2004-126023 A 4/2004
(Continued)

OTHER PUBLICATIONS

Official Communication issued in International Patent Application No. PCT/JP2017/032830, dated Nov. 7, 2017.

*Primary Examiner* — Adam J Snyder
(74) *Attorney, Agent, or Firm* — Keating & Bennett, LLP

(57) ABSTRACT

An object of the disclosure is to achieve a stable display quality without an effect of variation in temperature in a display device including a display element driven by an electric current.

The display device is provided with a thermistor as a temperature detector detecting an ambient temperature. A scanning signal amplitude controller changes the voltage level of a gate low voltage in accordance with temperature indicated by temperature data acquired by the thermistor. An in-panel driver controller gives, to a gate driver, a gate clock signal of which the voltage level on a high level side is set at the voltage level of a gate high voltage and the voltage level on a low level side is set at the voltage level of the gate (Continued)

low voltage. The gate driver outputs a scanning signal on the basis of the gate clock signal.

7 Claims, 18 Drawing Sheets

(51) Int. Cl.
    *G01K 1/14*         (2006.01)
    *G01K 7/22*         (2006.01)
    *G09G 3/3266*     (2016.01)
    *G09G 3/3275*     (2016.01)
    *G09G 3/3225*     (2016.01)
    *G09G 3/20*         (2006.01)
    *H01L 27/32*      (2006.01)

(52) U.S. Cl.
    CPC ............. *G09G 3/3275* (2013.01); *G09G 3/20* (2013.01); *G09G 3/3225* (2013.01); *G09G 2300/0819* (2013.01); *G09G 2300/0842* (2013.01); *G09G 2300/0861* (2013.01); *G09G 2310/0251* (2013.01); *G09G 2320/0233* (2013.01); *G09G 2320/0242* (2013.01); *G09G 2320/041* (2013.01); *G09G 2330/028* (2013.01); *H01L 27/3276* (2013.01)

(58) Field of Classification Search
    USPC .......................................................... 345/691
    See application file for complete search history.

(56) References Cited

U.S. PATENT DOCUMENTS

| | | | |
|---|---|---|---|
| 2009/0033685 A1* | 2/2009 | Park | G09G 3/3233 345/690 |
| 2009/0079727 A1 | 3/2009 | Ozawa | |
| 2009/0201231 A1* | 8/2009 | Takahara | G09G 3/3233 345/76 |
| 2009/0315813 A1* | 12/2009 | Uchino | G09G 3/3233 345/76 |
| 2013/0293527 A1 | 11/2013 | Minami | |
| 2014/0232708 A1 | 8/2014 | Kitazawa et al. | |
| 2015/0062195 A1 | 3/2015 | Kumeta et al. | |
| 2015/0115826 A1* | 4/2015 | Koo | G09G 3/3266 315/210 |
| 2015/0187277 A1* | 7/2015 | Maeyama | G09G 3/3291 345/694 |
| 2016/0098957 A1* | 4/2016 | Eom | G09G 3/3225 345/78 |
| 2017/0004772 A1* | 1/2017 | Han | G09G 3/3258 |
| 2017/0098409 A1* | 4/2017 | Heo | G09G 3/3266 |
| 2018/0261175 A1* | 9/2018 | Feng | G09G 3/3233 |
| 2018/0293944 A1* | 10/2018 | Kim | G09G 3/3266 |
| 2019/0057668 A1* | 2/2019 | Xiong | G09G 3/3696 |

FOREIGN PATENT DOCUMENTS

| | | |
|---|---|---|
| JP | 2009-080252 A | 4/2009 |
| JP | 2013-235025 A | 11/2013 |
| JP | 2014-157221 A | 8/2014 |
| JP | 2014-202826 A | 10/2014 |
| JP | 2015-049335 A | 3/2015 |

* cited by examiner

DISPLAY DEVICE INCLUDING PIXEL CIRCUITS INCLUDING DISPLAY ELEMENTS DRIVEN BY ELECTRIC CURRENT

TECHNICAL FIELD

The disclosure described below relates to a display device, and more particularly to a display device (e.g., an organic EL display device) including a display element driven by an electric current and a driving method for the same.

BACKGROUND ART

Organic EL display devices including pixel circuits including organic Electro Luminescence (EL) elements (hereinafter referred to as an "organic EL element") have recently been coming into practical use. The organic EL element is a self-luminous display element that emits light with luminance in accordance with the amount of an electric current passing through the element. An organic EL display device using such an organic EL element being a self-luminous display element can be easily thinned, reduced in power consumption, and increased in luminance as compared with a liquid crystal display device requiring backlights, color filters, and the like.

The pixel circuit of the organic EL display device includes a driving transistor, a writing control transistor, a holding capacitor, and the like, in addition to the organic EL element. The driving transistor and the writing control transistor are typically composed of thin film transistors (TFT). The holding capacitor is connected with a gate terminal being a control terminal of the driving transistor and, via a data line, is applied with a voltage in accordance with a data signal (image signal) indicating an image to be displayed. The driving transistor is connected with the organic EL element in series and controls the amount of an electric current passing through the organic EL element in accordance with the voltage held by the holding capacitor.

Concerning the above-described organic EL display device, various types of control with temperature have been proposed to improve display quality. JP 2013-235025 A describes a technique that increases a writing potential (control potential) as temperature increases, in consideration of the waveform of a gate pulse becoming dull when temperature is increased. JP 2004-126023 A describes a technique that varies a potential of a scanning signal in a period other than a select period in accordance with temperature. JP 2014-202826 A describes a technique that varies an initialization voltage in accordance with temperature.

CITATION LIST

Patent Literature

PTL 1: JP 2013-235025 A
PTL 2: JP 2004-126023 A
PTL 3: JP 2014-202826 A

SUMMARY

Technical Problem

The threshold voltage of the driving transistor in the pixel circuit varies in accordance with temperature. Thus, the charging performance of the holding capacitor in the pixel circuit varies in accordance with temperature. In specific, concerning the holding capacitor, a lower temperature is more likely to cause insufficient charging, and a higher temperature is more likely to cause overcharge. Because of such variation in the charging performance of the holding capacitor due to temperature, organic EL display devices in the related art do not achieve a stable display quality. For example, although the same image is displayed, its luminance or color level varies in accordance with temperature.

Therefore, an object of the disclosure described below is to achieve a stable display quality without an effect of variation in temperature in a display device including a display element driven by an electric current.

Solution to Problem

A display device according to some embodiments of the disclosure includes a display panel including a plurality of data lines, a plurality of scanning signal lines intersecting with the plurality of data lines, and a plurality of pixel circuits corresponding to intersections between the plurality of data lines and the plurality of scanning signal lines. The display device includes: a data line driver configured to apply a data signal to the plurality of data lines; a scanning signal line driver configured to apply a scanning signal to the plurality of scanning signal lines; a scanning signal amplitude controller configured to control amplitude of the scanning signal; and a temperature detector configured to detect an ambient temperature. Each of the pixel circuits includes a display element driven by an electric current; and a capacitance element configured to be charged in accordance with the data signal applied to a corresponding data line with a voltage level of the scanning signal being a level for writing, the scanning signal being applied to corresponding one of the scanning signal lines. The scanning signal amplitude controller is configured to increase the amplitude of the scanning signal as the ambient temperature detected by the temperature detector is lower.

A display device according to other embodiments of the disclosure includes a display panel including a plurality of data lines, a plurality of scanning signal lines intersecting with the plurality of data lines, a plurality of light emission control lines corresponding to the plurality of scanning signal lines on a one-to-one basis, and a plurality of pixel circuits corresponding to intersections between the plurality of data lines and the plurality of scanning signal lines. The display device includes: a data line driver configured to apply a data signal to the plurality of data lines; a scanning signal line driver configured to apply a scanning signal to the plurality of scanning signal lines; a light emission control line driver configured to apply a light emission control signal to the plurality of light emission control lines; a light emission period controller configured to control a length of a period in which a voltage level of the light emission control signal is kept in a level for light emission; and a temperature detector configured to detect an ambient temperature. Each of the pixel circuits includes a display element driven by an electric current; and a capacitance element configured to be charged in accordance with the data signal applied to a corresponding data line with a voltage level of the scanning signal being a level for writing, the scanning signal being applied to corresponding one of the scanning signal lines. In each of the pixel circuits, the display element is configured to emit light with the voltage level of the light emission control signal being the level for light emission, the light emission control signal being applied to corresponding one of the light emission control lines. The light emission period controller is configured to increase the length of the period in which the voltage level of the light emission control signal is kept in the level for light emission as the ambient temperature detected by the temperature detector is lower.

Advantageous Effects of Disclosure

According to some embodiments of the disclosure, the amplitude of the scanning signal is controlled in accordance with temperature detected by the temperature detector. At this time, as the temperature is lower, the amplitude of the scanning signal is increased. Thus, the occurrence of insufficient charging at a low temperature and the occurrence of overcharge at a high temperature are suppressed in the capacitance element (holding capacitor) in the pixel circuit. Accordingly, variation in the luminance or color level due to variation in temperature is suppressed, thereby ensuring a stable display quality. In this way, in the display device including the display element driven by an electric current, a stable display quality is achieved without an effect of variation in temperature.

According to other embodiments of the disclosure, the length of the period in which the voltage level of the light emission control signal keeps in the level for light emission (i.e., the length of a light emission period) is controlled in accordance with temperature detected by the temperature detector. At this time, as the temperature is lower, the length of the light emission period is increased. Thus, even if a low temperature causes insufficient charging of the capacitance element (holding capacitor), the display element emits light in a period longer than an original period to compensate for the insufficient charging. Furthermore, even if a high temperature causes overcharge of the capacitance element (holding capacitor), the display element emits light in a period shorter than an original period to compensate for the overcharge. Accordingly, variation in the luminance or color level due to variation in temperature is suppressed, thereby ensuring a stable display quality. In this way, in the display device including the display element driven by an electric current, a stable display quality is achieved without an effect of variation in temperature.

DESCRIPTION OF EMBODIMENTS

Embodiments will be described below with reference to the accompanying drawings. Assume that i and j each represent an integer equal to or greater than 2, m represents an integer from 1 to i, and n represents an integer from 1 to j in the following description.

1. First Embodiment 1.1 Overall Configuration

Figure 2:
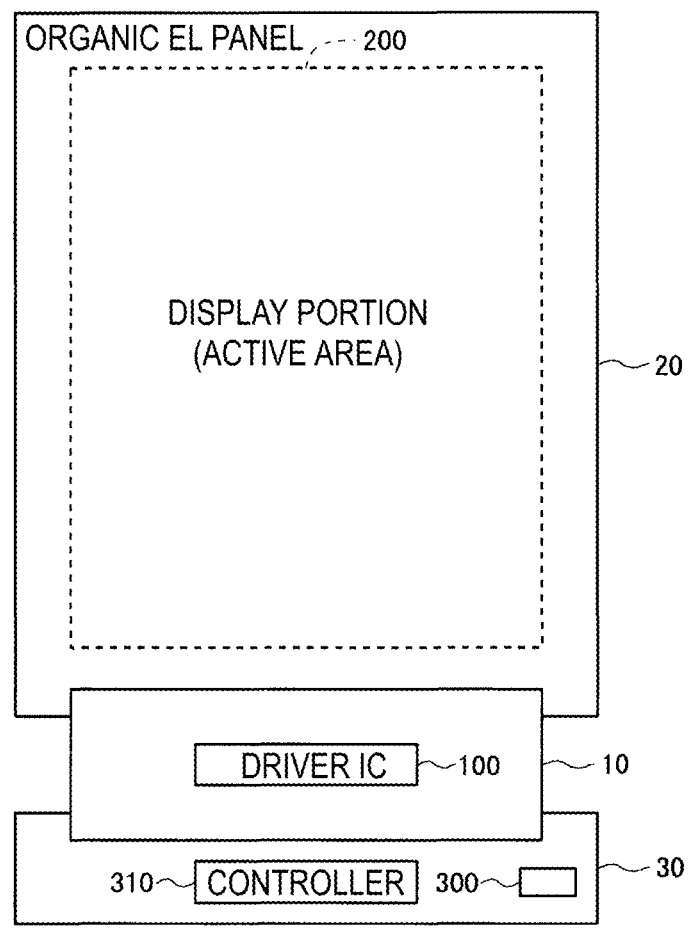
FIG. 2 is a schematic view of a configuration of the organic EL display device according to the first embodiment.

FIG. 2 is a schematic view of a configuration of an organic EL display device according to a first embodiment. As illustrated in FIG. 2, this organic EL display device is configured by an organic EL panel 20, a control board (control board) 30, and a flexible printed circuit board (FPC) 10. The control board 30 is disposed on the back face of the organic EL panel 20, and the FPC 10 connects the organic EL panel 20 with the control board 30. The organic EL panel 20 includes a display portion (active area) 200 displaying an image. A driver IC 100 is mounted on the FPC 10, and a controller 310 and a thermistor 300 being a temperature detector are mounted on the control board 30.

Figure 3:
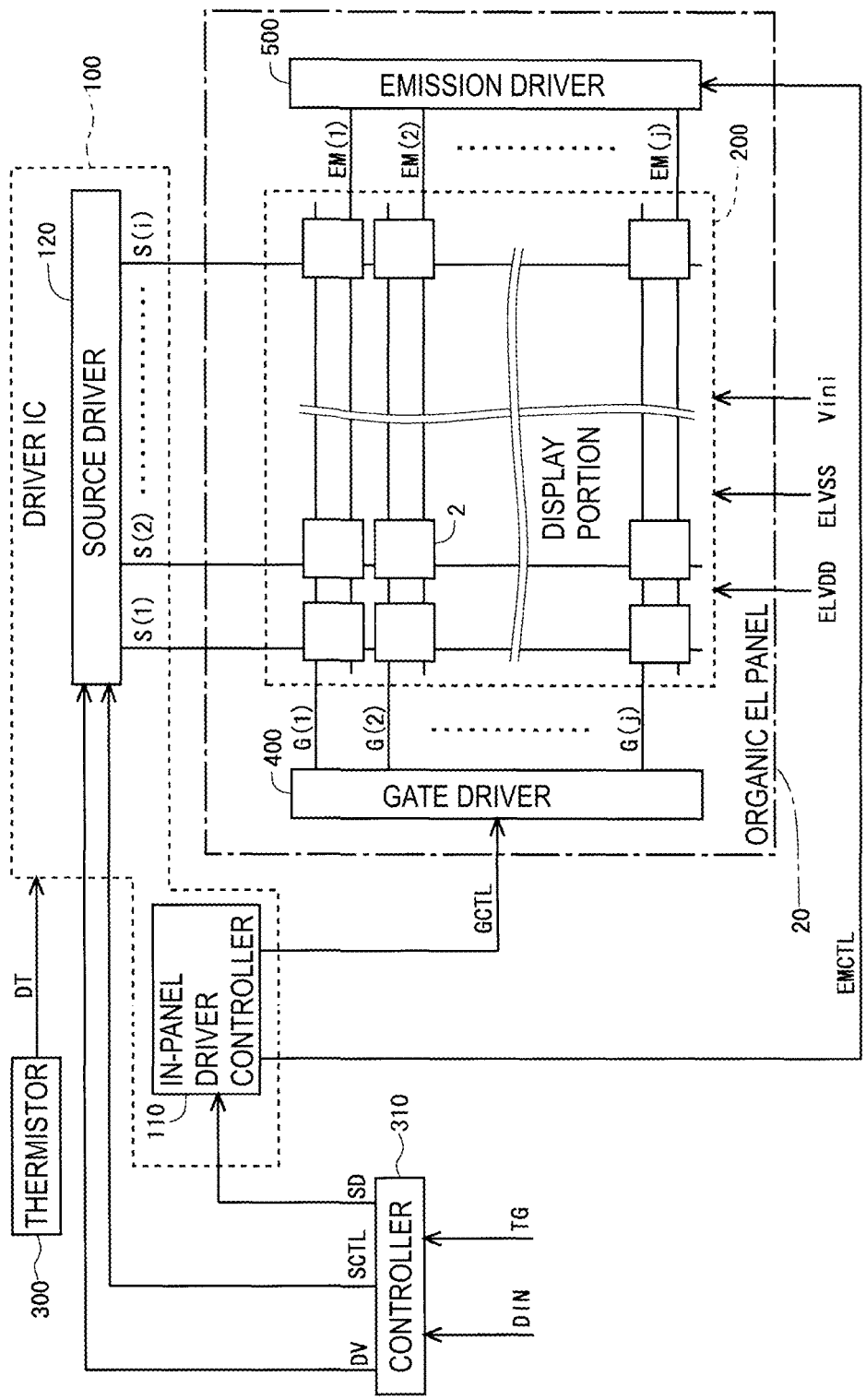
FIG. 3 is a block diagram illustrating an overall configuration for image display in the first embodiment.

FIG. 3 is a block diagram illustrating an overall configuration for image display. This organic EL display device includes the controller 310, an in-panel driver controller 110, a source driver 120, a gate driver 400, an emission driver 500, the display portion 200, and the thermistor 300. The in-panel driver controller 110 and the source driver 120 are disposed in the driver IC 100. In addition to the display portion 200, the gate driver 400 and the emission driver 500 are disposed in the organic EL panel 20. To be more specific, the gate driver 400 and the emission driver 500 are formed to be monolithic. However, a configuration may also be used in which these drivers are not formed to be monolithic.

In the display portion 200, i data lines S(1) to S(i) and j scanning signal lines G(1) to G(j) orthogonal to these data lines are arranged. In the display portion 200, j light emission control lines EM(1) to EM(j) are also arranged, corresponding to j scanning signal lines G(1) to G(j) on a one-to-one basis. The scanning signal lines G(1) to G(j) and the light emission control lines EM(1) to EM(j) are typically parallel to each other. Further, the display portion 200 is provided with i×j pixel circuits 2 corresponding to intersections between i data lines S(1) to S(i) and j scanning signal lines G(1) to G(j). In this way, the i×j pixel circuits 2 are provided to form a pixel matrix of i columns×j rows on the display portion 200. In the following description, when necessary, scanning signals given to j scanning signal lines G(1) to G(j) are also designated by reference signs G(1) to G(j), light emission control signals given to j light emission control lines EM(1) to EM(j) are also designated by reference signs EM(1) to EM(j), and data signals given to i data lines S(1) to S(i) are also designated by reference signs S(1) to S(i).

In the display portion 200, power source lines (not illustrated) which are common to the pixel circuits 2 are also arranged. To be more specific, a power source line which supplies a high-level power source voltage ELVDD for driving organic EL elements (hereinafter, referred to as a "high level power source line"), a power source line which supplies a low-level power source voltage ELVSS for driving the organic EL elements (hereinafter, referred to as a "low level power source line"), and a power source line which supplies an initialization voltage Vini (hereinafter, referred to as an "initialization power source line") are arranged. The high-level power source voltage ELVDD, the low-level power source voltage ELVSS, and the initialization voltage Vini are supplied from a power source circuit (not illustrated).

Actions of the constituent elements illustrated in FIG. 3 will be described below. The controller 310 receives an input image signal DIN and a group of timing signals (such as a horizontal synchronization signal and a vertical synchronization signal) TG transmitted from outside, and the controller 310 outputs a digital video signal DV, a source control signal SCTL for controlling actions of the source driver 120, and a driver control signal SD for controlling actions of the in-panel driver controller 110. The thermistor 300 outputs temperature data DT indicating an ambient temperature. The in-panel driver controller 110 receives the driver control signal SD and outputs a gate control signal GCTL for controlling actions of the gate driver 400 and an emission driver control signal EMCTL for controlling actions of the emission driver 500. At this time, the amplitude (in specific, voltage on the low level side) of a gate clock signal, which will be described later, included in the gate control signal GCTL is controlled by the temperature data DT. The source control signal SCTL includes a source start pulse signal, a source clock signal, a latch strobe signal, and the like. The gate control signal GCTL includes a gate start pulse signal, a gate clock signal, and the like. The emission driver control signal EMCTL includes an emission start pulse signal, an emission clock signal, and the like.

The source driver 120 is connected with i data lines S(1) to S(i). The source driver 120 receives the digital video signal DV and source control signal SCTL output from the controller 310, and the source driver 120 applies the data signals to i data lines S(1) to S(i). That is, the source driver 120 functions as a data line driver driving i data lines S(1) to S(i). The source driver 120 includes an i-bit shift register, a sampling circuit, a latch circuit, i D/A converters, and the like, which are not illustrated. The shift register includes i registers connected with each other in a cascade manner. The shift register sequentially transfers a pulse of a source start pulse signal supplied to a first stage register from an input terminal to an output terminal on the basis of the source clock signal. In response to this pulse transferring, sampling pulses are output from respective stages of the shift register. The sampling circuit stores the digital video signal DV on the basis of the sampling pulses. The latch circuit gets and holds the digital video signal DV for one row stored in the sampling circuit in accordance with the latch strobe signal. The D/A converters are provided to correspond to the data lines S(1) to S(i). The D/A converters convert components of the digital video signal DV held by the latch circuit into analog voltages. The converted analog voltages are simultaneously applied as data signals to all the data lines S(1) to S(i).

The gate driver 400 is connected with j scanning signal lines G(1) to G(j). The gate driver 400 applies the scanning signals to j scanning signal lines G(1) to G(j) on the basis of the gate control signal GCTL output from the in-panel driver controller 110. That is, the gate driver 400 functions as a scanning signal line driver driving j scanning signal lines G(1) to G(j).

The emission driver 500 is connected with j light emission control lines EM(1) to EM(j). The emission driver 500 applies the light emission control signals to j light emission control lines EM(1) to EM(j) on the basis of the emission driver control signal EMCTL output from the in-panel driver controller 110. That is, the emission driver 500 functions as a light emission control line driver driving j light emission control lines EM(1) to EM(j).

As described above, by applying the data signals to i data lines S(1) to S(i), applying the scanning signals to j scanning signal lines G(1) to G(j), and applying the light emission control signals to j light emission control lines EM(1) to EM(j), an image based on the input image signal DIN is displayed on the display portion 200.

1.2 Pixel Circuit

1.2.1 Configuration of Pixel Circuit

Figure 4:
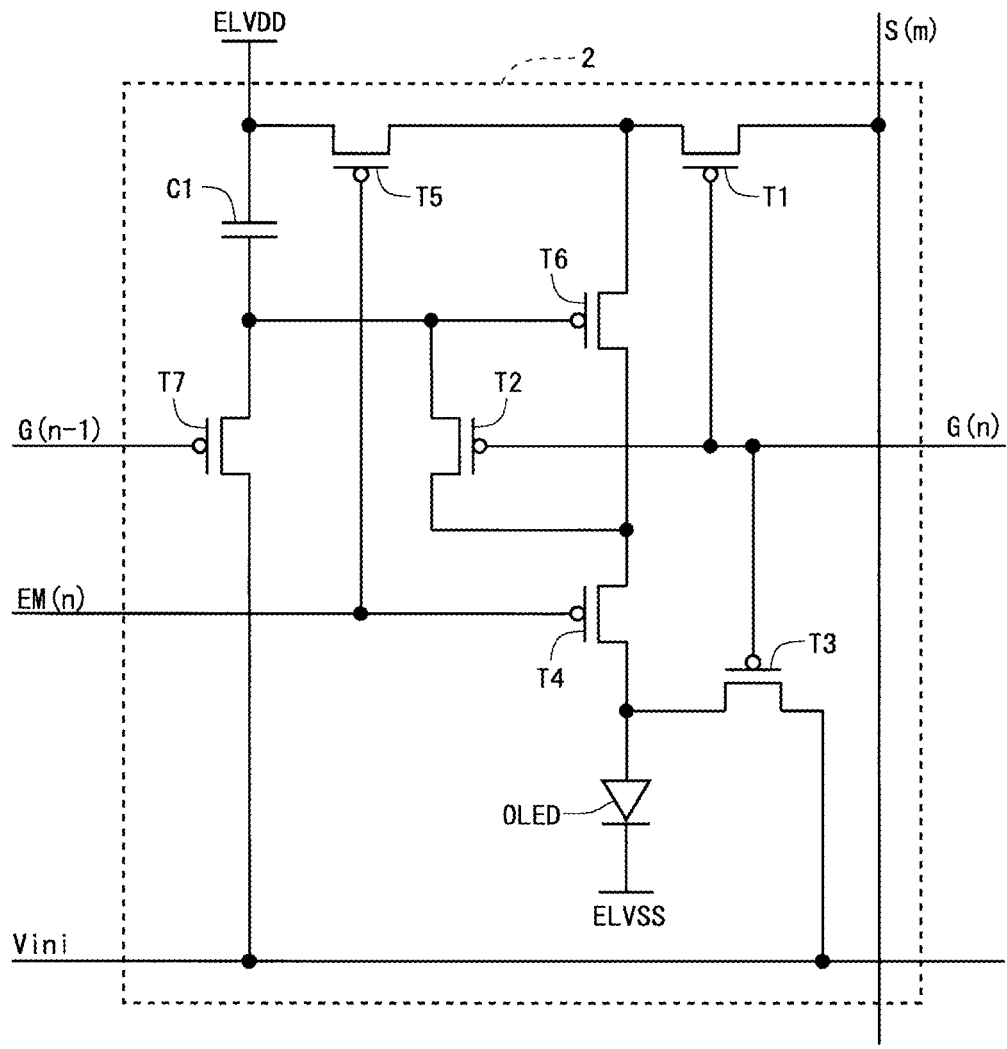
FIG. 4 is a circuit diagram illustrating a configuration of a pixel circuit corresponding to an n-th row and an m-th column in the first embodiment.

Next, a configuration and actions of the pixel circuits 2 in the display portion 200 will be described. Note that the configuration of the pixel circuits 2 described hereinafter is merely an example, and no such limitation is intended. FIG. 4 is a circuit diagram illustrating a configuration of the pixel circuit 2 corresponding to an n-th row and an m-th column. The pixel circuit 2 illustrated in FIG. 4 includes one organic EL element OLED, seven transistors T1 to T7 (a writing control transistor T1, a threshold voltage compensation transistor T2, an anode control transistor T3, a light emission control transistor T4, a power supply control transistor T5, a driving transistor T6, and an initialization transistor T7), and one holding capacitor C1. The transistors T1 to T7 are p-channel thin film transistors. The holding capacitor C1 is a capacitance element including two electrodes (first electrode and second electrode).

Note that one, having a higher potential, of the drain and the source of a p-channel transistor is called a source; however, some of the transistors T1 to T7 have such a relationship in height of the potential between two terminals other than a gate terminal (control terminal) that changes depending on the state. Thus, concerning the transistors T1 to T7, in the following description, one of the two terminals other than the gate terminal is referred to as a "first conduction terminal", and the other is referred to as a "second conduction terminal".

The writing control transistor T1 includes a gate terminal connected with the scanning signal line G(n) in the n-th row; a first conduction terminal connected with the data line S(m) in the m-th column; and a second conduction terminal connected with a second conduction terminal of the power supply control transistor T5 and a first conduction terminal of the driving transistor T6. The threshold voltage compensation transistor T2 includes a gate terminal connected with the scanning signal line G(n) in the n-th row; a first conduction terminal connected with a first conduction terminal of the light emission control transistor T4 and a second conduction terminal of the driving transistor T6; and a second conduction terminal connected with a gate terminal of the driving transistor T6, a first conduction terminal of the initialization transistor T7, and the second electrode of the holding capacitor C1. The anode control transistor T3 includes a gate terminal connected with the scanning signal line G(n) in the n-th row; a first conduction terminal connected with an anode terminal of the organic EL element OLED; and a second conduction terminal connected with the initialization power source line. The light emission control transistor T4 includes a gate terminal connected with the light emission control line EM(n) in the n-th row; the first conduction terminal connected with the first conduction terminal of the threshold voltage compensation transistor T2 and the second conduction terminal of the driving transistor T6; and a second conduction terminal connected with the first conduction terminal of the anode control transistor T3 and the anode terminal of the organic EL element OLED.

The power supply control transistor T5 includes a gate terminal connected with the light emission control line EM(n) in the n-th row; a first conduction terminal connected with the high level power source line and the first electrode of the holding capacitor C1; and the second conduction terminal connected with the second conduction terminal of the writing control transistor T1 and the first conduction terminal of the driving transistor T6. The driving transistor T6 includes the gate terminal connected with the second conduction terminal of the threshold voltage compensation transistor T2, the first conduction terminal of the initialization transistor T7, and the second electrode of the holding capacitor C1; the first conduction terminal connected with the second conduction terminal of the writing control transistor T1 and the second conduction terminal of the power supply control transistor T5; and the second conduction terminal connected with the first conduction terminal of the threshold voltage compensation transistor T2 and the first conduction terminal of the light emission control transistor T4. The initialization transistor T7 includes a gate terminal connected with the scanning signal line G(n−1) in an (n−1)-th row; the first conduction terminal connected with the second conduction terminal of the threshold voltage compensation transistor T2, the gate terminal of the driving transistor T6, and the second electrode of the holding capacitor C1; and a second conduction terminal connected with the initialization power source line.

The holding capacitor C1 includes the first electrode connected with the high level power source line and the first conduction terminal of the power supply control transistor T5; and the second electrode connected with the second conduction terminal of the threshold voltage compensation transistor T2, the gate terminal of the driving transistor T6, and the first conduction terminal of the initialization transistor T7. The organic EL element OLED includes the anode terminal connected with the first conduction terminal of the anode control transistor T3 and the second conduction terminal of the light emission control transistor T4; and a cathode terminal connected with the low level power source line.

1.2.2 Actions of Pixel Circuit

Figure 5:
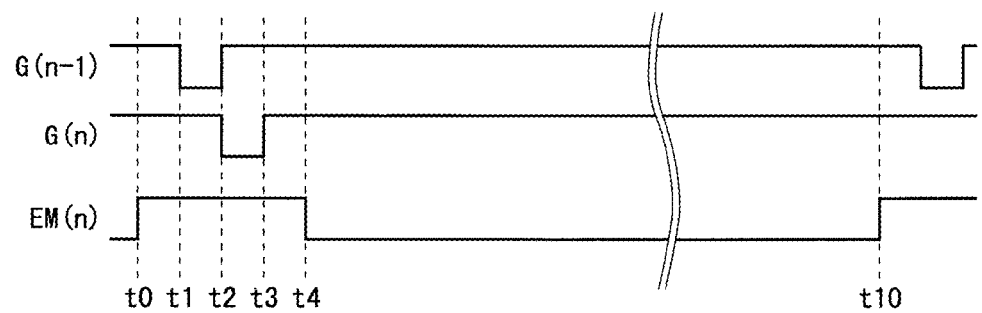
FIG. 5 is a timing chart for illustrating a driving method for the pixel circuit corresponding to the n-th row and the m-th column in the first embodiment.

FIG. 5 is a timing chart for illustrating a driving method for the pixel circuit 2 corresponding to the n-th row and the m-th column (the pixel circuit 2 illustrated in FIG. 4). In the period to a time t0, the scanning signal G(n−1) and the scanning signal G(n) are at a high level, and the light emission control signal EM(n) is at a low level. At this time, the light emission control transistor T4 is in an on state so that the organic EL element OLED emits light in accordance with the magnitude of a drive current.

At the time t0, the light emission control signal EM(n) changes from the low level to the high level. This turns the light emission control transistor T4 and the power supply control transistor T5 to an off state. As a result, the supply of the electric current to the organic EL element OLED is cut off so that the organic EL element OLED is switched off.

At a time t1, the scanning signal G(n−1) changes from the high level to the low level. This turns the initialization transistor T7 to an on state. As a result, the gate voltage of the driving transistor T6 is initialized. In other words, the gate voltage of the driving transistor T6 becomes equal to the initialization voltage Vini.

At a time t2, the scanning signal G(n−1) changes from the low level to the high level. This turns the initialization transistor T7 to an off state. At the time t2, the scanning signal G(n) is also changed from the high level to the low level. This turns the writing control transistor T1, the threshold voltage compensation transistor T2, and the anode control transistor T3 to an on state. By turning the anode control transistor T3 to an on state, the anode voltage of the organic EL element OLED is initialized on the basis of the initialization voltage Vini. Furthermore, by turning the writing control transistor T1 and the threshold voltage compensation transistor T2 to an on state, the data signal S(m) is given to the second electrode of the holding capacitor C1 via the writing control transistor T1, the driving transistor T6, and the threshold voltage compensation transistor T2. This allows the holding capacitor C1 to be charged.

At the time t3, the scanning signal G(n) is changed from the low level to the high level. This turns the writing control transistor T1, the threshold voltage compensation transistor T2, and the anode control transistor T3 to an off state.

At a time t4, the light emission control signal EM(n) changes from the high level to the low level. This turns the light emission control transistor T4 and the power supply control transistor T5 to an on state. Thus, a drive current in accordance with the charging voltage of the holding capacitor C1 is supplied to the organic EL element OLED. As a result, the organic EL element OLED emits light in accordance with the magnitude of the drive current. Thereafter, the organic EL element OLED emits light throughout the period to a time t10 when the light emission control signal EM(n) changes from the low level to the high level.

1.2.3 Overall Actions

Figure 6:
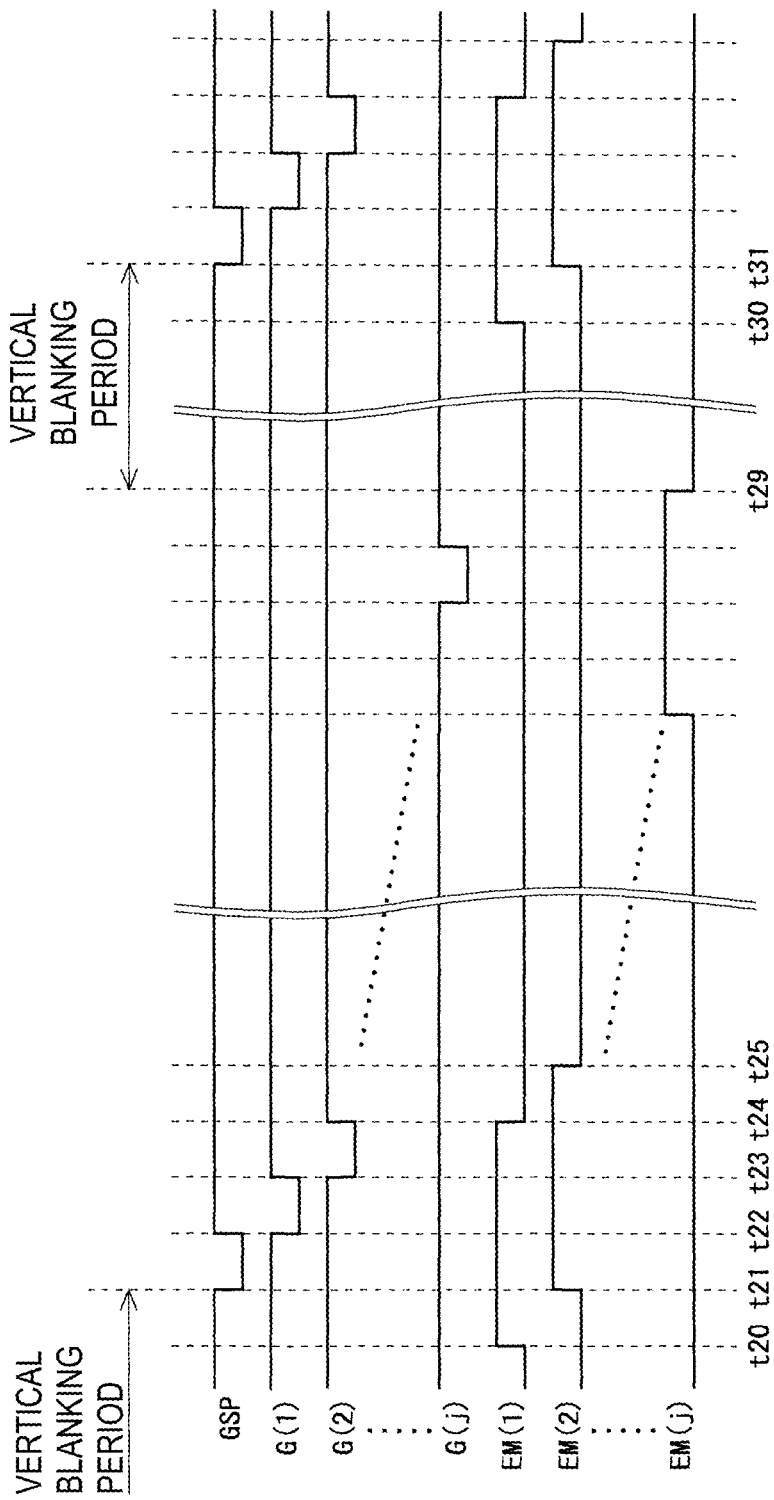
FIG. 6 is a timing chart for illustrating overall actions in the first embodiment.

Next, overall actions based on the above-described actions of one pixel circuit 2 will be described with reference to the timing chart illustrated in FIG. 6. At a time t20, the light emission control signal EM(1) changes from the low level to the high level. This switches off the organic EL element OLED included in each of the pixel circuits 2 in the first row.

At a time t21, the gate start pulse signal GSP changes from the high level to the low level. The gate start pulse signal GSP is given to the gate terminal of the initialization transistor T7 included in each of the pixel circuits 2 in the first row. This initializes the gate voltage of the driving transistor T6 in each of the pixel circuits 2 in the first row. At the time t21, the light emission control signal EM(2) also changes from the low level to the high level. This switches off the organic EL element OLED included in each of the pixel circuits 2 in the second row.

At a time t22, the scanning signal G(1) changes from the high level to the low level. This initializes the gate voltage of the driving transistor T6 in each of the pixel circuits 2 in the second row. In addition, the holding capacitor C1 in each of the pixel circuits 2 in the first row is charged on the basis of the data signal S.

At a time t23, the scanning signal G(1) changes from the low level to the high level. At the time t23, the scanning signal G(2) also changes from the high level to the low level. This initializes the gate voltage of the driving transistor T6 in each of the pixel circuits 2 in the third row. In addition, the holding capacitor C1 in each of the pixel circuits 2 in the second row is charged on the basis of the data signal S.

At a time t24, the light emission control signal EM(1) changes from the high level to the low level. This supplies a drive current to the organic EL element OLED in each of the pixel circuits 2 in the first row, and the organic EL element OLED emits light in accordance with the magnitude of the drive current. Then, at a time t25, the light emission control signal EM(2) changes from the high level to the low level. This supplies a drive current to the organic EL element OLED in each of the pixel circuits 2 in the second row, and the organic EL element OLED emits light in accordance with the magnitude of the drive current. Thereafter, at a time t29, the light emission control signal EM(j) changes from the high level to the low level, and the organic EL element OLED thus emits light in each of the pixel circuits 2 in the j-th row. In this way, the organic EL elements OLED emit light sequentially row by row.

Thereafter, at a time t30, the light emission control signal EM(1) changes from the low level to the high level. This switches off the organic EL element OLED included in each of the pixel circuits 2 in the first row. At a time t31, the gate start pulse signal GSP changes from the high level to the low level. This initializes the gate voltage of the driving transistor T6 in each of the pixel circuits 2 in the first row. At the time t31, the light emission control signal EM(2) also changes from the low level to the high level. This switches off the organic EL element OLED included in each of the pixel circuits 2 in the second row. In this way, the same actions as those at the time t20 and subsequent times are repeated at the time t30 and subsequent times.

In the present embodiment, the amplitude of the scanning signal G is controlled with temperature. In specific, the voltage levels of the scanning signals G(1) to G(j) on the low level side are controlled with temperature in four levels. The voltage levels are switched in vertical blanking periods. Thus, the voltage levels of the scanning signals G(1) to G(j) on the low level side may change at the vertical blanking periods.

1.3 Gate Driver

A configuration of the gate driver 400 of the present embodiment will be described. Note that the configuration described hereinafter (the configuration illustrated in FIG. 7 or FIG. 8) is merely an example, and another configuration may be employed instead.

1.3.1 Overall Configuration of Gate Driver

The gate driver 400 (see FIG. 3) is achieved using a shift register. Each of stages of the shift register is provided, corresponding to the scanning signal lines G(1) to G(j) in the display portion 200 on a one-to-one basis. In other words, in the present embodiment, the gate driver 400 includes a shift register having j stages. Note that, hereinafter, a circuit constituting each of the stages of the shift register is referred to as a "unit circuit".

Figure 7:
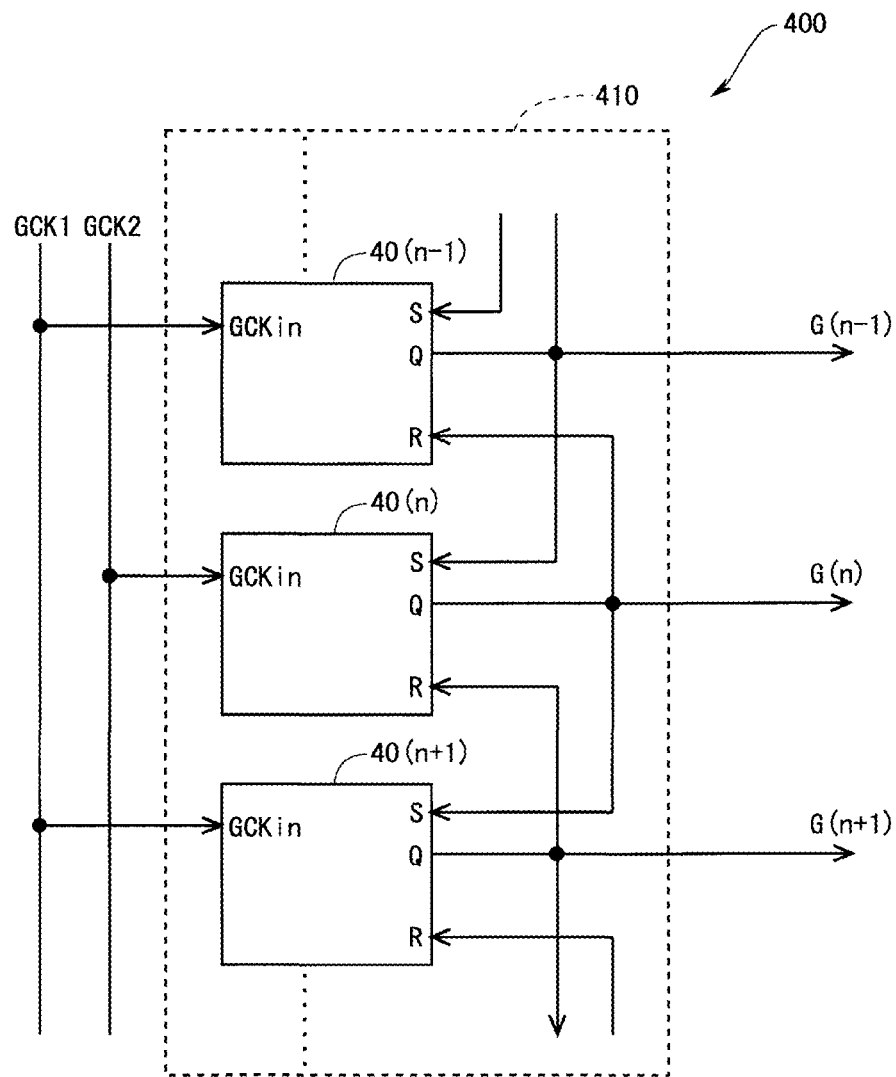
FIG. 7 is a block diagram illustrating an example overall configuration of a gate driver of the first embodiment.

FIG. 7 is a block diagram illustrating an example overall configuration of the gate driver 400. Note that FIG. 7 illustrates only unit circuits 40(n−1) to 40(n+1) constituting an (n−1)-th stage to an (n+1)-th stage in j stages. Herein, for the convenience of descriptions, it is assumed that n represents an even number. In the present embodiment, the gate clock signal GCK for enabling actions of the shift register 410 is configured by two-phase clock signals (gate clock signals GCK1 and GCK2). Note that a clock signal (gate clock signal) input to each of the unit circuits 40 between the two-phase clock signals is designated by reference sign GCKin.

As illustrated in FIG. 7, each of the stages (each of the unit circuits) of the shift register 410 includes an input terminal for receiving the gate clock signal GCKin, an input terminal for receiving a set signal S, an input terminal for receiving a reset signal R, and an output terminal for outputting an output signal Q.

With reference to FIG. 7, signals described below are given to the input terminals of each of the stages (each of the unit circuits) of the shift register 410. In odd-numbered stages, the gate clock signal GCK1 is given as the gate clock signal GCKin, and in even-numbered stages, the gate clock signal GCK2 is given as the gate clock signal GCKin. In any stage, the output signal Q output from the preceding stage is given as the set signal S, and the output signal Q output from the following stage is given as the reset signal R. However, in the first stage (not illustrated in FIG. 7), the gate start pulse signal GSP is given as the set signal S. Note that a high-level power source voltage (not illustrated in FIG. 7) is applied commonly to all the unit circuits 40. Each of the stages (each of the unit circuits) of the shift register 410 outputs the output signal Q. The output signal Q output from each of the stages is given to the corresponding scanning signal line as the scanning signal G, and is also given to the preceding stage as the reset signal R and to the following stage as the set signal S.

1.3.2 Configuration of Unit Circuit

Figure 8:
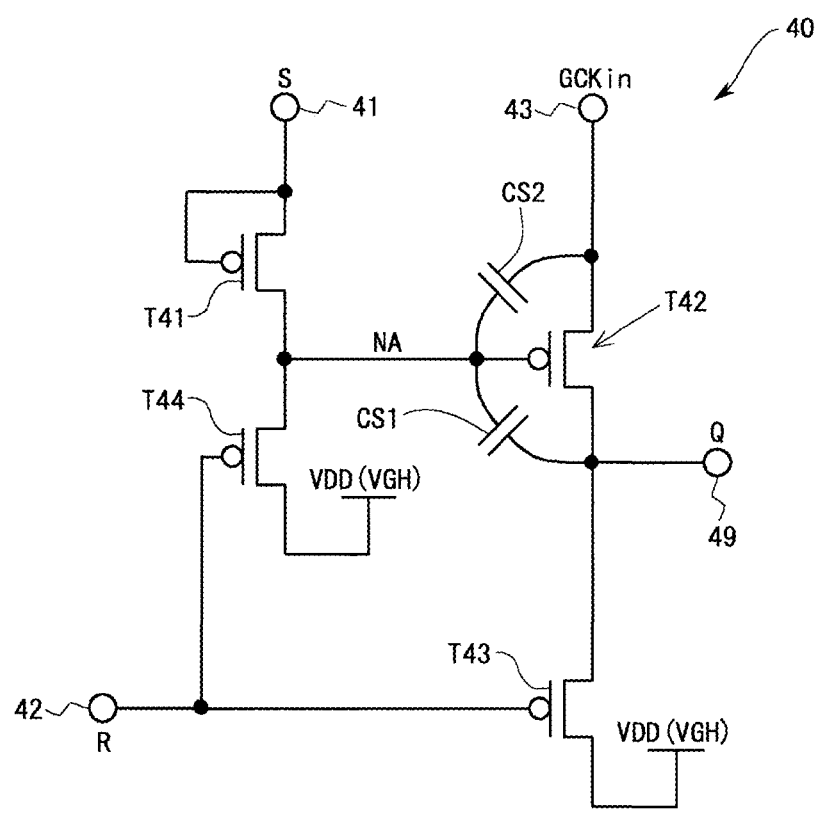
FIG. 8 is a circuit diagram illustrating a configuration example of a unit circuit in a shift register of the first embodiment.

FIG. 8 is a circuit diagram illustrating a configuration example of the unit circuit 40 in the shift register 410. As illustrated in FIG. 8, the unit circuit 40 includes four transistors T41 to T44. The unit circuit 40 also includes input terminals for a high-level power source voltage VDD, three input terminals 41 to 43, and one output terminal 49. Note that, in the present embodiment, the high-level power source voltage VDD applied to the unit circuit 40 is a gate high voltage VGH, which will be described later. With reference to FIG. 8, the input terminal receiving the set signal S is designated by a reference sign 41, the input terminal receiving the reset signal R is designated by a reference sign 42, and the input terminal receiving the gate clock signal GCKin is designated by a reference sign 43. The output terminal outputting the output signal Q is designated by a reference sign 49. A parasitic capacitance CS1 is formed between a gate terminal and a first conduction terminal of the transistor T42, and a parasitic capacitance CS2 is formed between the gate terminal and a second conduction terminal of the transistor T42. A first conduction terminal of the transistor T41, the gate terminal of the transistor T42, and a second conduction terminal of the transistor T44 are connected together. Note that, hereinafter, the region (wiring line) where these terminals are connected together is referred to as a "first node". The first node is designated by a reference sign NA.

The transistor T41 includes a gate terminal and a second conduction terminal both connected with the input terminal 41 (in other words, the transistor T41 is diode-connected), and the first conduction terminal connected with the first node NA. The transistor T42 includes the gate terminal connected with the first node NA, the first conduction terminal connected with the output terminal 49, and the second conduction terminal connected with the input terminal 43. The transistor T43 includes a gate terminal connected with the input terminal 42, a first conduction terminal connected with the input terminal for the high-level power source voltage VDD, and a second conduction terminal connected with the output terminal 49. The transistor T44 includes a gate terminal connected with the input terminal 42, a first conduction terminal connected with the input terminal for the high-level power source voltage VDD, and the second conduction terminal connected with the first node NA.

1.3.3 Actions of Unit Circuit

Figure 9:
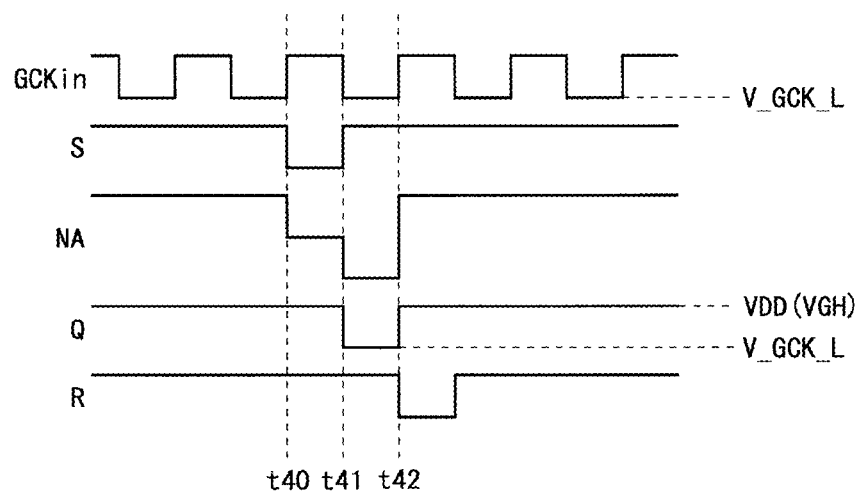
FIG. 9 is a timing chart for illustrating actions of the unit circuit of the first embodiment.

Actions of the unit circuit 40 will be described with reference to FIG. 8 and FIG. 9. As illustrated in FIG. 9, in the period to a time t40, the set signal S, the voltage of the first node NA, the output signal Q, and the reset signal R are at a high level. In addition, the gate clock signal GCKin alternately repeating a high level and a low level is given to the input terminal 43. Note that, in FIG. 9, the voltage of the gate clock signal GCKin on the low level side is represented by V_GCK_L.

At a time t40, the set signal S changes from the high level to the low level. The transistor T41 is diode-connected as illustrated in FIG. 8 so that the change of the set signal S from the high level to the low level turns the transistor T41 to an on state. This decreases the voltage of the first node NA.

At a time t41, the set signal S changes from the low level to the high level. This turns the transistor T41 to an off state. At this time, the reset signal R is at the high level so that the transistor T44 is in an off state. With the above operation, the first node NA is turned to a floating state. At the time t41, the gate clock signal GCKin also changes from the high level to the low level. As described above, the parasitic capacitance CS1 is formed between the gate terminal and the first conduction terminal of the transistor T42, and the parasitic capacitance CS2 is formed between the gate terminal and the second conduction terminal of the transistor T42. Thus, because of the bootstrap effect, the voltage of the first node NA decreases to a significantly low level. This decreases the voltage of the output signal Q (the voltage of the output terminal 49) to a level equivalent to that of the voltage V_GCK_L of the gate clock signal GCKin on the low level side. In other words, the voltage of the scanning signal G given to the scanning signal line connected with the output terminal 49 of this unit circuit 40 decreases to the level equivalent to that of the voltage V_GCK_L of the gate clock signal GCKin on the low level side. Note that, in the period from the time t41 to a time t42, the reset signal R is at the high level. This keeps the transistor T43 in an off state so that the voltage of the output signal Q does not increase in this period.

At the time t42, the gate clock signal GCKin changes from the low level to the high level. Thus, as the voltage of the input terminal 43 increases, the voltage of the output signal Q increases. Furthermore, the voltage of the first node NA also increases through the parasitic capacitances CS1 and CS2. At the time t42, the reset signal R also changes from the high level to the low level. This turns the transistor T43 and the transistor T44 to an on state. By turning the transistor T43 to an on state, the voltage of the output signal Q increases to the high level, and by turning the transistor T44 to an on state, the voltage of the first node NA increases to the high level.

1.4 Control of Scanning Signal Voltage

As described above, in the present embodiment, the amplitude of the scanning signal G is controlled with temperature. In specific, the voltage level of the scanning signal G on the low level side changes on the basis of the temperature data DT acquired by the thermistor 300. A configuration for changing the amplitude of the scanning signal G (a configuration of main portions of the present embodiment) will be described below.

Figure 1:
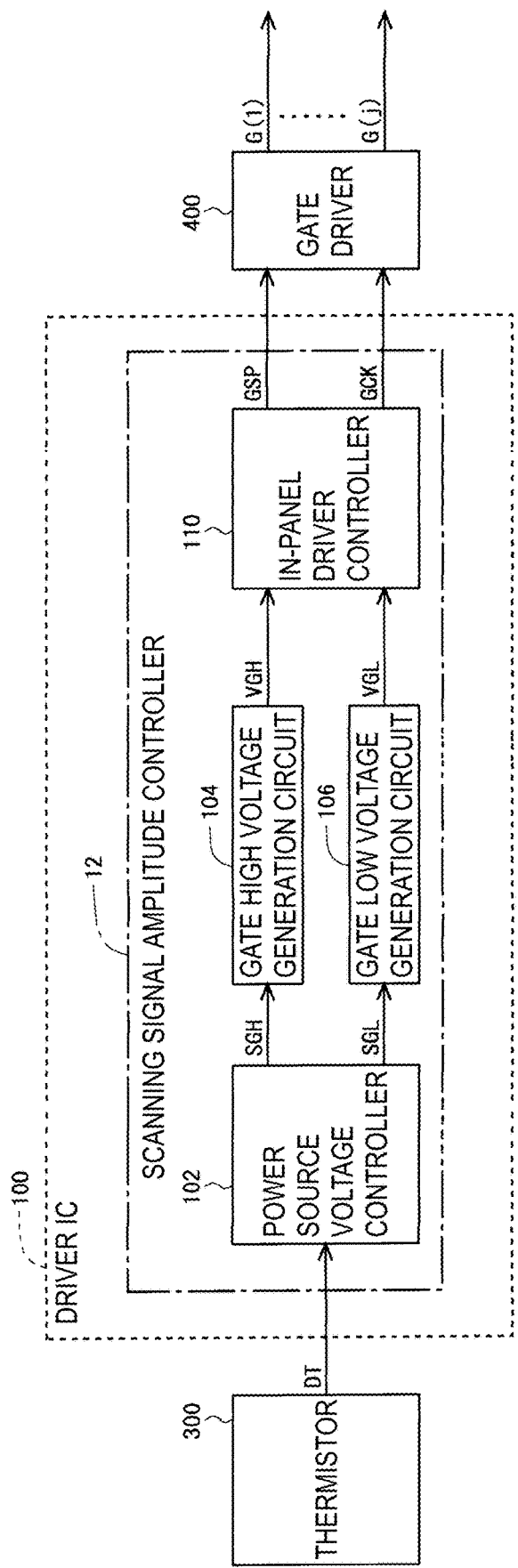
FIG. 1 is a block diagram illustrating a configuration of main portions of an organic EL display device according to a first embodiment.

FIG. 1 is a block diagram illustrating a configuration of the main portions of the present embodiment. As illustrated in FIG. 1, the organic EL display device according to the present embodiment includes, as constituent elements for changing the amplitude of the scanning signal G, the thermistor 300, a power source voltage controller 102, a gate high voltage generation circuit 104, a gate low voltage generation circuit 106, and the in-panel driver controller 110. Note that the power source voltage controller 102, the gate high voltage generation circuit 104, the gate low voltage generation circuit 106, and the in-panel driver controller 110 are disposed in the driver IC 100 and function as a scanning signal amplitude controller 12.

The thermistor 300 outputs the temperature data DT indicating an ambient temperature. The power source voltage controller 102 outputs a gate high voltage control signal SGH and a gate low voltage control signal SGL in accordance with the temperature data DT. The gate high voltage generation circuit 104 outputs the gate high voltage VGH in accordance with the gate high voltage control signal SGH. The gate low voltage generation circuit 106 outputs a gate low voltage VGL in accordance with the gate low voltage control signal SGL. The in-panel driver controller 110 gives the gate clock signal GCK and the gate start pulse signal GSP to the gate driver 400. Concerning the gate clock signal GCK and the gate start pulse signal GSP, the voltage level on the high level side is set at the voltage level of the gate high voltage VGH, and the voltage level on the low level side is set at the voltage level of the gate low voltage VGL. Note that, in the present embodiment, the voltage level of the gate high voltage VGH is maintained in a certain level, and the voltage level of the gate low voltage VGL is changed in four levels in accordance with temperature.

Figure 10:
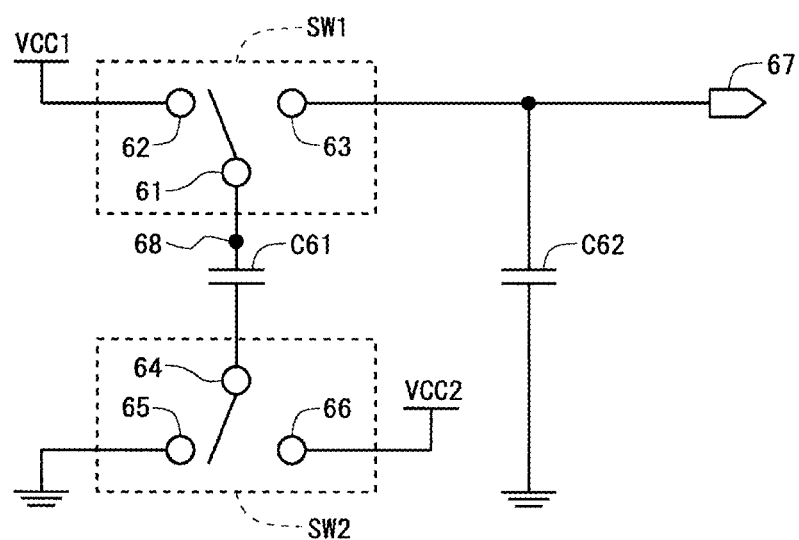
FIG. 10 is a circuit diagram illustrating a configuration example of a charge pump circuit achieving a gate high voltage generation circuit and a gate low voltage generation circuit of the first embodiment.

In the present embodiment, the gate high voltage generation circuit 104 and the gate low voltage generation circuit 106 are achieved using a charge pump circuit. FIG. 10 illustrates a configuration example of the charge pump circuit. As illustrated in FIG. 10, the charge pump circuit includes two switches SW1 and SW2 and two capacitors C61 and C62. The switch SW1 includes a terminal 62 applied with a DC voltage VCC1, and the switch SW2 includes a terminal 66 applied with a DC voltage VCC2. The switch SW1 includes a terminal 63 connected with an output terminal 67. In this configuration, first, a terminal 61 is connected with the terminal 62 in the switch SW1, and a terminal 64 is connected with a terminal 65 in the switch SW2. With this operation, the capacitor C61 is charged, and the voltage of a node 68 becomes VCC1. Next, the terminal 61 is connected with the terminal 63 in the switch SW1, and the terminal 64 is connected with the terminal 66 in the switch SW2. While the terminal 65 is grounded, the terminal 66 is applied with the DC voltage VCC2. Thus, by switching the connection of the terminal 64 from the terminal 65 to the terminal 66, the voltage of the node 68 increases to a level "VCC1+VCC2" through the capacitor C61. Then, the voltage "VCC1+VCC2" is output from the output terminal 67.

In the present embodiment, the voltage level of the voltage that is output from the gate low voltage generation circuit 106 including the above-described charge pump circuit and that is applied to the in-panel driver controller 110 as the gate low voltage VGL is controlled and is changed in four levels in accordance with temperature. Here, three examples (first to third examples) are provided to describe specific techniques for achieving the control of the voltage level of the gate low voltage VGL in accordance with temperature.

First Example

Figure 11:
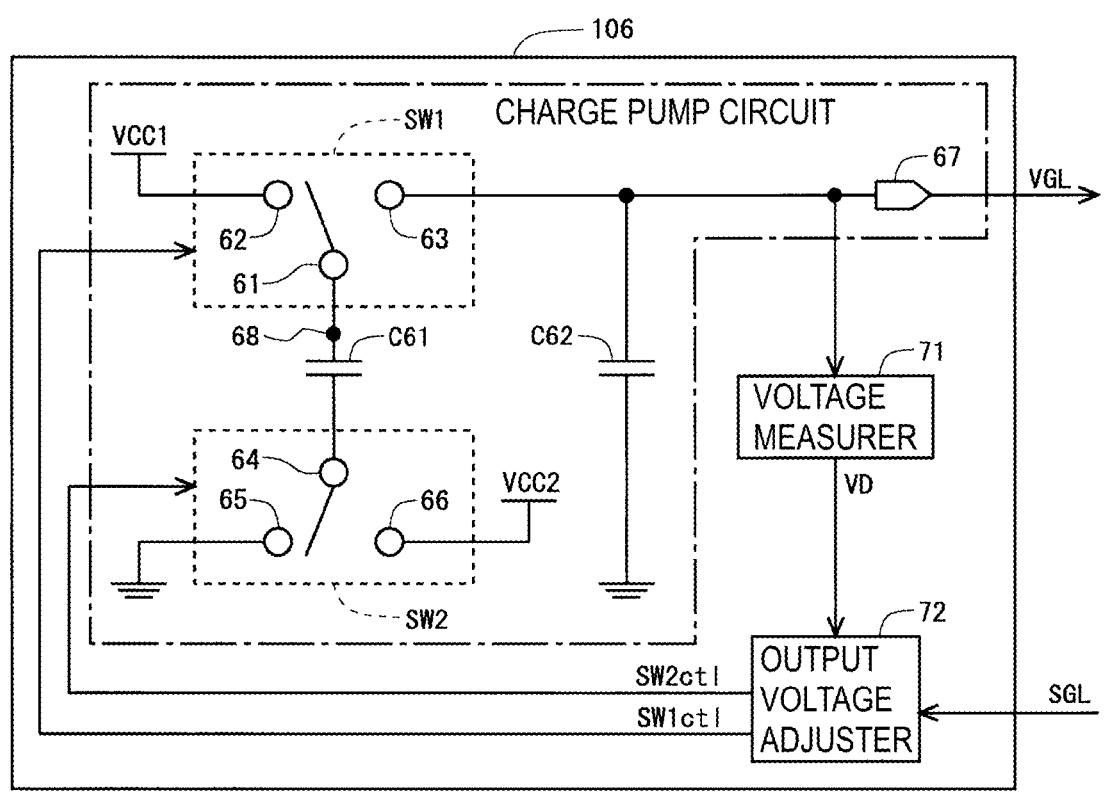
FIG. 11 is a diagram for illustrating a first example concerning control of a gate low voltage in accordance with temperature in the first embodiment.

FIG. 11 is a circuit diagram for illustrating the first example. As illustrated in FIG. 11, in the first example, the gate low voltage generation circuit 106 includes a voltage measurer 71 and an output voltage adjuster 72 in addition to the charge pump circuit. In the first example, the gate low voltage control signal SGL is given to the output voltage adjuster 72, and the output voltage from the charge pump circuit is output from the gate low voltage generation circuit 106 as the gate low voltage VGL. The voltage measurer 71 measures the voltage of the output terminal 67 and provides a detected voltage VD to the output voltage adjuster 72. The output voltage adjuster 72 outputs a control signal SW1ctl for controlling a connection state of the switch SW1 and a control signal SW2ctl for controlling a connection state of the switch SW2 on the basis of the gate low voltage control signal SGL being a signal in accordance with temperature. If the detected voltage VD is below a target voltage at this time, the output voltage adjuster 72 controls the connection states of the switches SW1 and SW2 by outputting such control signals SW1ctl and SW2ctl that a step-up action is repeated to make the detected voltage VD closer to the target voltage. If the detected voltage VD is above the target voltage, the output voltage adjuster 72 controls the connection states of the switches SW1 and SW2 by outputting such control signals SW1ctl and SW2ctl that the step-up action is suspended. In this way, the voltage level of the output voltage (gate low voltage VGL) can be controlled within a range to "VCC1+VCC2". Note that, as temperature is lower, the target voltage is decreased, and, as temperature is higher, the target voltage is increased. As described above, in the first example, by controlling the step-up action in the charge pump circuit, the voltage level of the gate low voltage VGL is controlled in four levels.

Second Example

Figure 12:
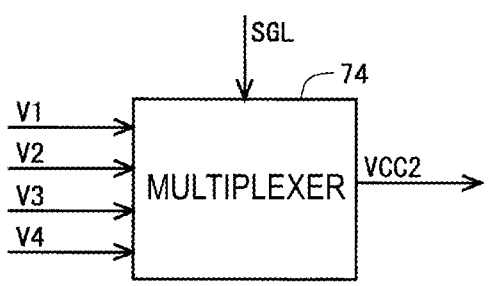
FIG. 12 is a diagram for illustrating a second example concerning control of a gate low voltage in accordance with temperature in the first embodiment.
Figure 13:
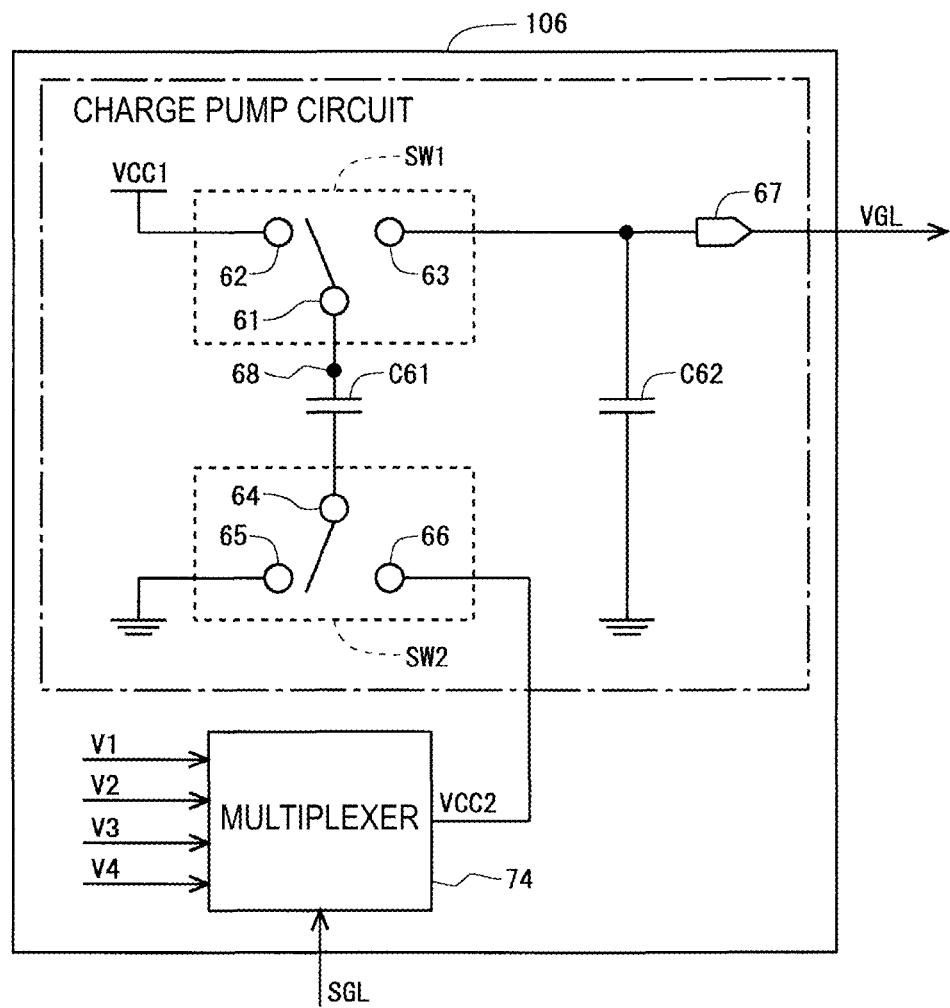
FIG. 13 is a diagram for illustrating the second example concerning control of a gate low voltage in accordance with temperature in the first embodiment.

In the second example, one or both of the DC voltage VCC1 and the DC voltage VCC2 are prepared in plurality, and one of the voltages is selected in accordance with temperature, thereby controlling the output voltage. As one example, four voltages V1 to V4 having different levels are prepared as the DC voltages VCC2. A multiplexer is provided for selecting one voltage from these four voltages V1 to V4 in accordance with temperature. As illustrated in FIG. 12, the multiplexer 74 selects one voltage from the four voltages V1 to V4 on the basis of the gate low voltage control signal SGL being a signal in accordance with temperature and outputs the selected voltage as the DC voltage VCC2. In the case of this example, the gate low voltage generation circuit 106 has the configuration illustrated in FIG. 13. That is, the gate low voltage generation circuit 106 includes the multiplexer 74 in addition to the charge pump circuit. The gate low voltage control signal SGL is given to the multiplexer 74, and the output voltage from the charge pump circuit is output from the gate low voltage generation circuit 106 as the gate low voltage VGL. Note that, in the multiplexer 74, as temperature is lower, a voltage having a lower voltage level is selected, and as temperature is higher, a voltage having a higher voltage level is selected. The output voltage from the charge pump circuit is "VCC1+VCC2", and the DC voltage VCC2 changes in accordance with temperature in four levels. Thus, the output voltage (gate low voltage VGL) also changes in accordance with temperature in four levels. As described above, in the second example, by selecting one from a plurality of prepared DC voltages (input voltages) in accordance with temperature, the voltage level of the gate low voltage VGL is controlled in four levels.

Note that, instead of preparing a plurality of DC voltages, the voltage level of a DC voltage (in specific, one or both of the voltage levels of the DC voltage VCC1 and the DC voltage VCC2) may be changed in accordance with temperature using a linear regulator or the like.

Third Example

Figure 14:
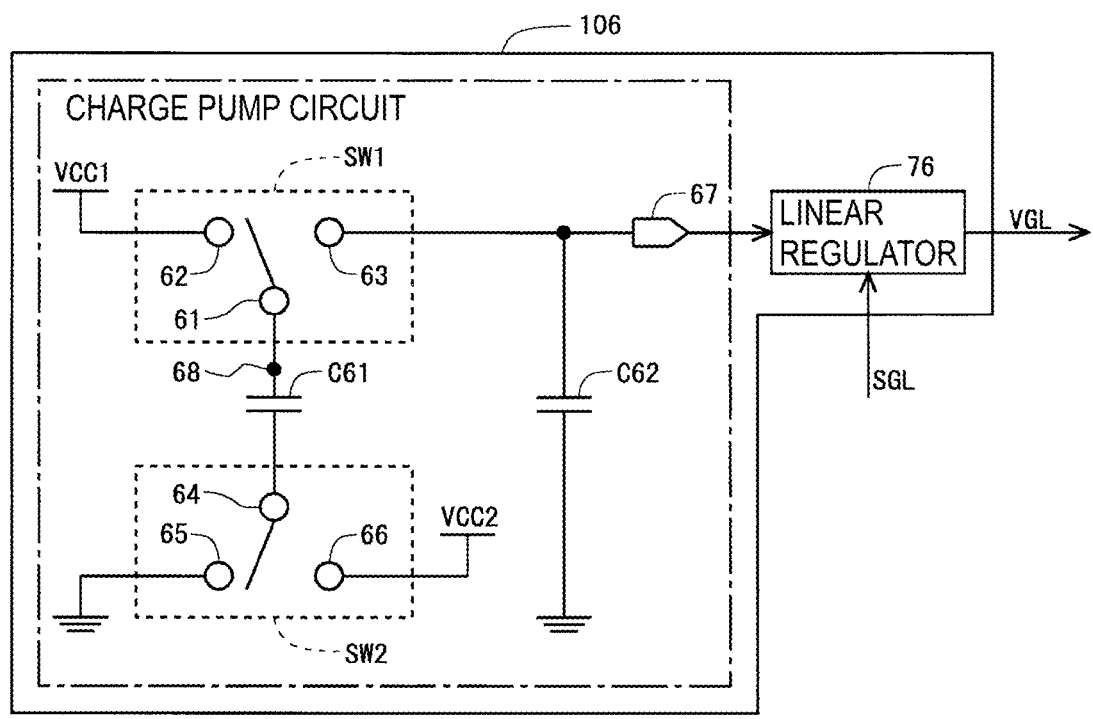
FIG. 14 is a diagram for illustrating a third example concerning control of a gate low voltage in accordance with temperature in the first embodiment.

FIG. 14 is a circuit diagram for illustrating the third example. As illustrated in FIG. 14, in the third example, the gate low voltage generation circuit 106 includes a linear regulator 76 in addition to the charge pump circuit. The linear regulator 76 is disposed in a stage following the charge pump circuit. In the third example, the gate low voltage control signal SGL is given to the linear regulator 76, and the output voltage from the linear regulator 76 is output from the gate low voltage generation circuit 106 as the gate low voltage VGL. The linear regulator 76 steps down the output voltage from the charge pump circuit on the basis of the gate low voltage control signal SGL being a signal in accordance with temperature. At this time, as temperature is lower, the output voltage is stepped down more significantly, and as temperature is higher, the output voltage is stepped down less significantly. As described above, in the third example, by controlling the output voltage from the charge pump circuit using the linear regulator 76, the voltage level of the gate low voltage VGL is controlled in four levels.

Note that, in the third example, a configuration using a switching regulator instead of the charge pump circuit may be employed. In this case, the switching regulator generates a predetermined voltage, and the linear regulator 76 steps down the predetermined voltage on the basis of the gate low voltage control signal SGL.

In this way, the voltage level of the gate low voltage VGL applied from the gate low voltage generation circuit 106 to the in-panel driver controller 110 is changed in four levels in accordance with temperature. As temperature is lower, the gate low voltage VGL has a lower voltage level, and as temperature is higher, the gate low voltage VGL has a higher voltage level.

The in-panel driver controller 110 gives, to the gate driver 400, the gate clock signal GCK the voltage level of which on the high level side is set at the voltage level of the gate high voltage VGH and the voltage level of which on the low level side is set at the voltage level of the gate low voltage VGL. When a scanning signal line is selected, the voltage of the scanning signal G decreases to the level equivalent to that of the voltage of the gate clock signal GCKin on the low level side as described above. Thus, the voltage level of the voltage represented by V_GCK_L in FIG. 9 is equal to the voltage level of the gate low voltage VGL. In other words, the voltage level of the scanning signal G in selecting a scanning signal line is set at the voltage level of the gate low voltage VGL. As described above, each of the unit circuits 40 in the shift register 410 constituting the gate driver 400 is applied with the gate high voltage VGH as the high-level power source voltage VDD (see FIG. 8). After a scanning signal line is selected, the scanning signal line is applied with the high-level power source voltage VDD. In other words, the voltage level of the scanning signal G with no scanning signal line selected is set at the voltage level of the gate high voltage VGH.

Thus, the voltage level of the scanning signal G on the high level side is set at the voltage level of the gate high voltage VGH, and the voltage level of the scanning signal G on the low level side is set at the voltage level of the gate low voltage VGL. The voltage level of the gate low voltage VGL is changed in four levels in accordance with temperature. Accordingly, the amplitude of the scanning signal G is changed in four levels in accordance with temperature. In specific, as temperature is lower, the scanning signal G has a higher amplitude, and as temperature is higher, the scanning signal G has a lower amplitude.

Figure 15:
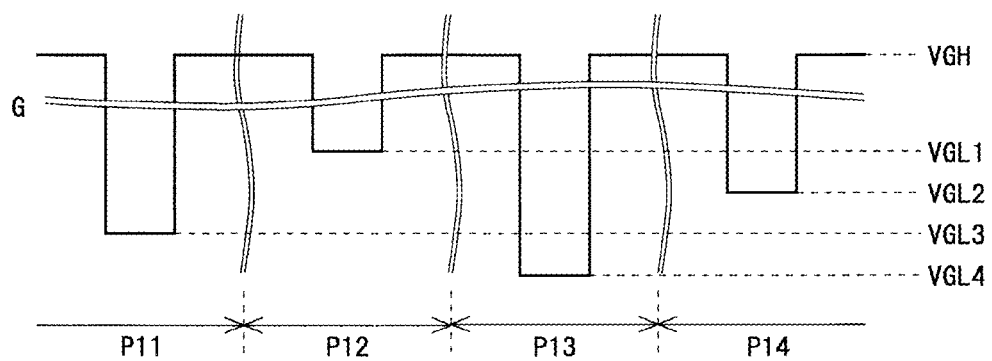
FIG. 15 is a diagram for illustrating control of the amplitude of a scanning signal in the first embodiment.

In the present embodiment, the scanning signal amplitude controller 12 changes the voltage level of the gate low voltage VGL in four levels in accordance with temperature in the vertical blanking period. Thus, the waveform of the scanning signal G in, for example, four periods P11 to P14 is as illustrated in FIG. 15. Concerning the periods P11 to P14, it is assumed that temperature is higher in descending order of P12, P14, P11, and P13. As illustrated in FIG. 15, the gate low voltage has a voltage level VGL3 in the period P11, a voltage level VGL1 in the period P12, a voltage level VGL4 in the period P13, and a voltage level VGL2 in the period P14. These voltage levels have a relationship "VGL1>VGL2>VGL3>VGL4". In this way, as temperature is lower, the scanning signal G has a higher amplitude, and as temperature is higher, the scanning signal G has a lower amplitude.

1.5 Effects

According to the present embodiment, the amplitude of the scanning signal G is controlled in four levels in accordance with temperature detected by the thermistor 300. At this time, as temperature is lower, the scanning signal G has a higher amplitude, and as temperature is higher, the scanning signal G has a lower amplitude. Thus, the occurrence of insufficient charging at a low temperature and occurrence of overcharge at a high temperature are suppressed in the holding capacitor C1 in the pixel circuit 2. Accordingly, variation in the luminance or color level due to variation in temperature is suppressed, thereby ensuring a stable display quality. In this way, the present embodiment achieves a stable display quality without an effect of variation in temperature in the organic EL display device.

2. Second Embodiment

2.1 Overview

In the above-described first embodiment, the amplitude of the scanning signal G (in specific, the voltage level of the scanning signal G on the low level side) is changed in accordance with temperature to compensate for a difference in charging performance of the holding capacitor C1 (see FIG. 4) due to a difference in temperature. On the other hand, in the present embodiment, the length of a light emission period is adjusted in accordance with temperature to compensate for a difference in charging performance of the holding capacitor C1 due to a difference in temperature. Descriptions of the same points as those in the above-described first embodiment will be omitted, and points different from those in the first embodiment will be described below.

2.2 Configuration

Figure 16:
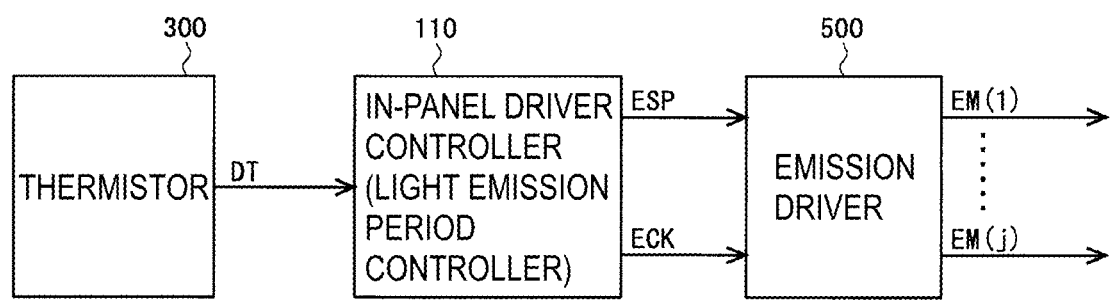
FIG. 16 is a block diagram for illustrating a configuration for adjusting the length of a light emission period in accordance with temperature in a second embodiment.

FIG. 16 is a block diagram for illustrating a configuration for adjusting the length of a light emission period in accordance with temperature. In the present embodiment, the temperature data DT acquired by the thermistor 300 is given to the in-panel driver controller 110. The in-panel driver controller 110 gives an emission start pulse signal ESP and an emission clock signal ECK as the emission driver control signal EMCTL (see FIG. 3), to the emission driver 500. At this time, the in-panel driver controller 110 adjusts timing of changing the waveform of the emission start pulse signal ESP in accordance with temperature indicated by the temperature data DT. In specific, the timing of changing the waveform of the emission start pulse signal ESP is adjusted so that, as the temperature is lower, the length of the light emission period is longer.

2.3 Actions

Figure 17:
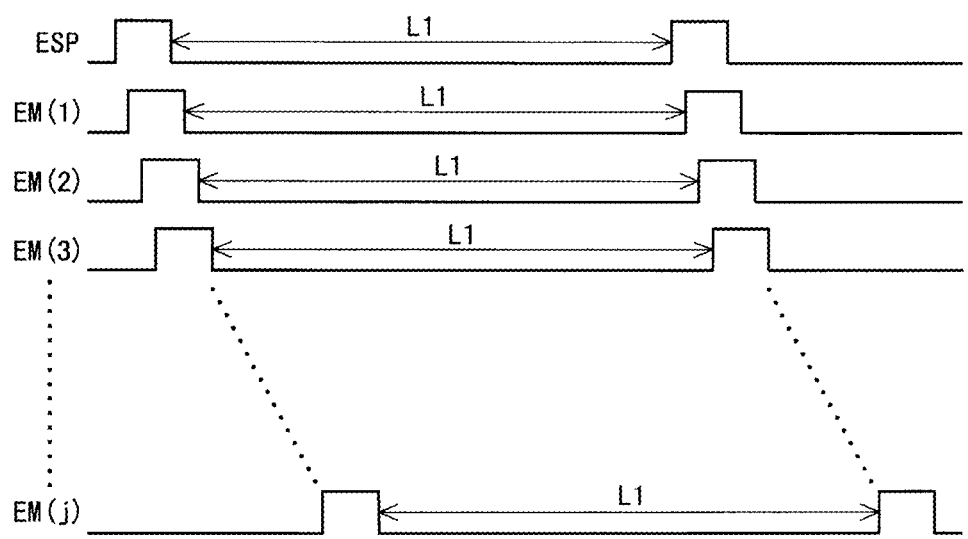
FIG. 17 is a timing chart for illustrating actions for adjusting the length of the light emission period in the second embodiment.

FIG. 17 is a timing chart for illustrating actions for adjusting the length of the light emission period. The emission driver 500 is configured by a shift register including j flip-flop circuits, for example. Each of the stages of the shift register outputs such a light emission control signal EM that the light emission period in each row has a length corresponding to the pulse width of the emission start pulse signal ESP. For example, as illustrated in FIG. 17, let L1 represent the pulse width of the emission start pulse signal ESP (here, the length of a period in which the emission start pulse signal is kept in a low level), and the length of a period in which each of the light emission control signals EM(1) to EM(j) is kept in a low level is also L1. It is thus understood that, by adjusting the timing of changing the waveform of the emission start pulse signal ESP, the length of the period in which the light emission control signal EM is kept in the low level is controlled. Accordingly, the in-panel driver controller 110 of the present embodiment functions as a light emission period controller controlling the length of the period in which the voltage level of the light emission control signal EM is kept in a level for light emission (i.e., the length of the light emission period). Furthermore, as temperature is lower, the in-panel driver controller 110 increases the length of the period in which the voltage level of the light emission control signal EM is kept in the level for light emission.

Figure 18:
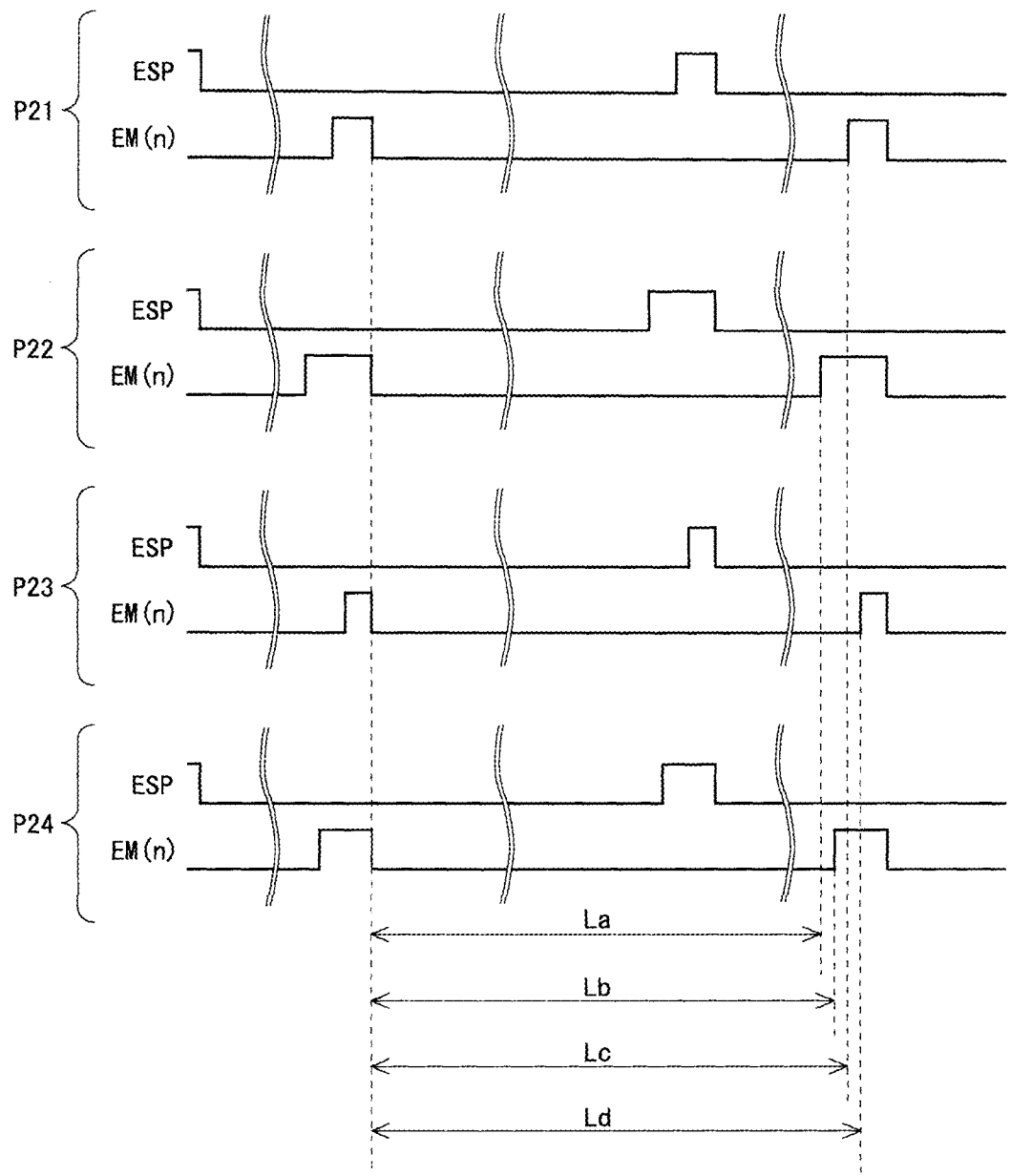
FIG. 18 is a diagram for illustrating adjustment of the length of the light emission period in the second embodiment.

In the present embodiment, the in-panel driver controller 110 changes the pulse width of the emission start pulse signal ESP in four levels in accordance with temperature in the vertical blanking period. Thus, the waveforms of the emission start pulse signal ESP and the light emission control signal EM(n) in the n-th row, for example, in four periods P21 to P24 are as illustrated in FIG. 18. Concerning the periods P21 to P24, it is assumed that temperature is higher in descending order of P22, P24, P21, and P23. As illustrated in FIG. 18, the light emission period has a length Lc in the period P21, a length La in the period P22, a length Ld in the period P23, and a length Lb in the period P24. These lengths have a relationship "La<Lb<Lc<Ld". In this way, as temperature is lower, the light emission period is longer, and, as temperature is higher, the light emission period is shorter.

2.4 Effects

According to the present embodiment, the length of the period in which the voltage level of the light emission control signal EM is kept in the level for light emission (i.e., the length of the light emission period) is controlled in four levels in accordance with temperature detected by the thermistor 300. At this time, as temperature is lower, the light emission period is longer, and as temperature is higher, the light emission period is shorter. Thus, even if a low temperature causes insufficient charging of the holding capacitor C1, the organic EL element emits light in a period longer than an original period to compensate for the insufficient charging. Furthermore, even if a high temperature causes overcharge of the holding capacitor C1, the organic EL element emits light in a period shorter than an original period to compensate for the overcharge. Accordingly, variation in the luminance or color level due to variation in temperature is suppressed, thereby ensuring a stable display quality. In this way, similarly to the above-described first embodiment, the present embodiment achieves a stable display quality without an effect of variation in temperature in the organic EL display device.

3. Modified Example

Modified examples of the above-described embodiments will be described below.

3.1 Control with Temperature

In the above-described first embodiment, the amplitude of the scanning signal G (in specific, the voltage level of the scanning signal G on the low level side) is changed in accordance with temperature. In the above-described second embodiment, the length of the light emission period is changed in accordance with temperature. However, only changing either one of the amplitude of the scanning signal G or the length of the light emission period in accordance with temperature may be insufficient to compensate for a difference in charging performance of the holding capacitor C1 due to a difference in temperature. Thus, both of the amplitude of the scanning signal G and the length of the light emission period (the length of the period in which the voltage level of the light emission control signal EM is kept in the level for light emission) may be changed in accordance with temperature. This effectively compensates for a difference in charging performance of the holding capacitor C1 from a difference in temperature and can thus achieve more stable display quality.

In the above-described embodiments, the amplitude of the scanning signal G or the length of the light emission period is controlled in four levels in accordance with temperature. However, the disclosure is not limited to this, and the amplitude of the scanning signal G or the length of the light emission period may be controlled in levels other than four levels in accordance with temperature. Note that the number of levels is typically 2 to the k-th power (k is a natural number).

3.2 Thermistor

In the above-described embodiments, the thermistor 300 is disposed on the control board 30. However, the disclosure is not limited to this, and the thermistor 300 may be disposed in the organic EL panel 20. Note that, when the readiness of the layout is required, the thermistor 300 is preferably disposed on the control board 30, and, when the accuracy of temperature is required, the thermistor 300 is preferably disposed in the organic EL panel 20.

Furthermore, in the above-described embodiments, only one thermistor 300 is provided; however, the disclosure is not limited to this, and a plurality of thermistors 300 may be provided. In this case, for example, the amplitude of the scanning signal G or the length of the light emission period may be controlled on the basis of an average value of temperature acquired by the plurality of thermistors 300. When especially a medium- or large-size organic EL panel 20 is employed, it is conceivable that a difference in temperature is great depending on the position. Thus, by providing a plurality of thermistors 300 in this way, display quality can be maintained more suitably.

4. Other Matters

The above-described embodiments have exemplified an organic EL display device in the description; however, the type of a display device is not particularly limited as long as the display device uses display elements driven by an electric current. The display elements that can be used here are display elements whose luminance or transmittance is controlled by an electric current. Display devices including such a display element include an EL display device such as an organic EL display device including an Organic Light Emitting Diode (OLED) and an inorganic EL display device including an inorganic light emitting diode; a QLED display device including a Quantum dot Light Emitting Diode (QLED); and the like.

REFERENCE SIGNS LIST

2 Pixel circuit
12 Scanning signal amplitude controller
20 Organic EL panel
100 Driver IC
102 Power source voltage controller
104 Gate high voltage generation circuit
106 Gate low voltage generation circuit
110 In-panel driver controller
300 Thermistor
400 Gate driver
500 Emission driver
C1 Holding capacitor
T1 Writing control transistor T2 Threshold voltage compensation transistor
T3 Anode control transistor
T4 Light emission control transistor
T5 Power supply control transistor
T6 Driving transistor
T7 Initialization transistor

The invention claimed is:

1. A display device including a display panel including a plurality of data lines, a plurality of scanning signal lines intersecting with the plurality of data lines, and a plurality of pixel circuits corresponding to intersections between the plurality of data lines and the plurality of scanning signal lines, the display device comprising:
   a data line driver that applies a data signal to the plurality of data lines;
   a scanning signal line driver that applies a scanning signal to the plurality of scanning signal lines;
   a scanning signal amplitude controller that controls an amplitude of the scanning signal; and
   a temperature detector that detects an ambient temperature, wherein
   each of the pixel circuits includes a display element driven by an electric current, and a capacitance element charged in accordance with the data signal applied to a corresponding data line with a voltage level of the scanning signal being a level for writing, the scanning signal being applied to a corresponding one of the scanning signal lines,
   the scanning signal amplitude controller increases the amplitude of the scanning signal as the ambient temperature detected by the temperature detector decreases to charge the capacitance element with a quantity of charge greater than a prescribed quantity in accordance with the data signal applied to the corresponding data line,
   the display device further comprises:
   a plurality of light emission control lines disposed in the display panel, the light emission control lines corresponding to the plurality of scanning signal lines on a one-to-one basis,
   a light emission control line driver that applies a light emission control signal to the plurality of light emission control lines, and
   a light emission period controller that controls a length of a period in which a voltage level of the light emission control signal is kept in a level for light emission, wherein
   in each of the pixel circuits, the display element emits light with the voltage level of the light emission control signal being the level for light emission, the light emission control signal being applied to a corresponding one of the light emission control lines, and
   the light emission period controller increases the length of the period in which the voltage level of the light emission control signal is kept in the level for light emission as the ambient temperature detected by the temperature detector decreases.

2. The display device according to claim 1, wherein the scanning signal amplitude controller controls the amplitude of the scanning signal by changing a voltage level corresponding to the level for writing.

3. The display device according to claim 1, wherein the scanning signal amplitude controller keeps one of a voltage level of the scanning signal on a high level side or a voltage level of the scanning signal on a low level side in a certain level and changes the other in accordance with the ambient temperature detected by the temperature detector.

4. The display device according to claim 3, wherein
   the scanning signal is transmitted to a control terminal of a p-channel transistor among transistors included in each of the pixel circuits, and
   the scanning signal amplitude controller changes the voltage level of the scanning signal on the low level side in accordance with the ambient temperature detected by the temperature detector.

5. The display device according to claim 1, wherein the temperature detector is a thermistor.

6. The display device according to claim 5, wherein
   the display device further includes a control board disposed on a back face of the display panel, and
   the thermistor is disposed on the control board.

7. The display device according to claim 5, wherein the thermistor is disposed in the display panel.

* * * * *